United States Patent
Iida et al.

(10) Patent No.: US 8,110,885 B2
(45) Date of Patent: Feb. 7, 2012

(54) SOLID STATE IMAGING DEVICE COMPRISING HYDROGEN SUPPLY FILM AND ANTIREFLECTION FILM

(75) Inventors: Satoko Iida, Susono (JP); Takanori Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 988 days.

(21) Appl. No.: 11/216,006

(22) Filed: Sep. 1, 2005

(65) Prior Publication Data

US 2006/0061674 A1    Mar. 23, 2006

(30) Foreign Application Priority Data

Sep. 3, 2004  (JP) ................................ 2004-257313

(51) Int. Cl.
*H01L 31/0232* (2006.01)
*H01L 27/146* (2006.01)

(52) U.S. Cl. .................. 257/437; 257/292; 257/E31.12; 257/E27.131

(58) Field of Classification Search ............... 257/431, 257/436, 437, E31.119, 290, 291, 292, 294, 257/432, E27.122, E27.127, E27.128, E27.129, 257/E27.13, E27.131, E27.132, E27.133, 257/E27.134, E31.12, E31.121, E31.122, 257/E31.123; 438/69, 72
See application file for complete search history.

(56) References Cited

U.S. PATENT DOCUMENTS

| | | | |
|---|---|---|---|
| 6,166,405 A | 12/2000 | Kuriyama et al. | 257/290 |
| 6,731,337 B2 | 5/2004 | Watanabe | 348/308 |
| 6,838,298 B2 | 1/2005 | Lee | 438/29 |
| 7,049,671 B2 * | 5/2006 | Kimura | 257/437 |
| 2003/0096438 A1 | 5/2003 | Lee | 438/29 |
| 2004/0217436 A1* | 11/2004 | Kimura | 257/461 |
| 2006/0043393 A1 | 3/2006 | Okita et al. | 257/93 |
| 2006/0044434 A1 | 3/2006 | Okita et al. | 348/294 |

FOREIGN PATENT DOCUMENTS

| | | |
|---|---|---|
| JP | 6-112453 | 4/1994 |
| JP | 6-204443 | 7/1994 |
| JP | 10-229180 | 8/1998 |
| JP | 2000-12822 | 1/2000 |
| JP | 2003-282856 | 10/2003 |

* cited by examiner

*Primary Examiner* — Samuel Gebremariam
*Assistant Examiner* — Andrew O. Arena
(74) *Attorney, Agent, or Firm* — Fitzpatrick, Cella, Harper & Scinto

(57) ABSTRACT

Provided is a MOS type solid state imaging device, including a semiconductor substrate, a plurality of pixels arranged on the semiconductor substrate, each pixel having a light receiving element for generating a signal charge due to incident light, and a MOS transistor for reading the signal charge, and a hydrogen supply film arranged on the semiconductor substrate over the plurality of pixels and having a region corresponding to the light receiving element at least a part of which has a film thickness greater than the other part of the region.

4 Claims, 8 Drawing Sheets

SOLID STATE IMAGING DEVICE COMPRISING HYDROGEN SUPPLY FILM AND ANTIREFLECTION FILM

BACKGROUND OF THE INVENTION

1. Field of the Invention

The present invention relates to a solid state imaging device, a method of manufacturing the solid state imaging device, and a digital camera that utilizes the solid state imaging device, and particularly relates to a solid state imaging device that includes an amplification element for each pixel or for each group of plural pixels.

2. Related Background Art

Currently, a photodiode is generally used as a light receiving element that converts an optical signal into an electric signal through light absorption. An active sensor (APS: Active Pixel Sensor), which amplifies a charge subjected to photoelectric conversion with the photodiode by means of an amplification element provided per pixel (or plural pixels) to generate a detection signal, is commercially available as a solid state imaging device provided in, for example, a digital camera.

In such a sensor, the charge generated in the photodiode is transferred by a transfer transistor. At this point, when a lattice defect exists on an interface of an oxide film under a gate of the transfer transistor, the charge generated in the photodiode is trapped by the defect, causing an incomplete transfer of the charge. Thus, in a state in which such a defect exists, and particularly in the case where a small amount of light is to be detected, it is hard to detect the corresponding signal. Therefore, the above-described defect causes a lowering of sensitivity, and becomes a cause for generating a dark current or noise.

In order to suppress various kinds of influences caused by defects on the interface of the oxide film, an interface level density needs to be reduced by reducing a defect density. Further, a defect due to a dangling bond on the interface of the oxide film is dominant over various kinds of defects as a defect that generates a carrier trap. Therefore, terminating the dangling bond with hydrogen is effective for reducing the influences caused by defects. Terminating the dangling bond with hydrogen is realized by forming a film containing hydrogen in the vicinity of a light receiving element and subjecting the film to heat treatment. In general, a plasma silicon nitride film as a surface protection film, and a side-wall-shaped plasma silicon nitride film disposed in the vicinity of the light receiving element each function as a hydrogen containing film for a hydrogen supply source (JP 06-112453 A, JP 2003-282856 A (corresponding to US 2003096438 A)).

Moreover, a method has been proposed in which hydrogen is effectively supplied to a semiconductor substrate while a sensitivity of a light receiving element is maintained (JP 2000-012822 A (corresponding to U.S. Pat. No. 6,166,405)).

Description will be made of such a conventional method with reference to FIG. 10. FIG. 10 is a sectional view of a light receiving element portion in a prior art. In FIG. 10, an n-type light receiving element 806 and an n-type semiconductor region 807 functioning as a detection portion are formed in a p-type well 804 on a surface of a semiconductor substrate made of silicon. Further, on the semiconductor substrate, a transfer electrode 809 made of polycrystalline silicon is formed on a region between the light receiving element 806 and the n-type semiconductor region 807 through an oxide film 803 formed through thermal oxidation. A photocharge generated in the light receiving element 806 is transferred to the n-type semiconductor region 807 through the transfer electrode 809. Further, an antireflection film 810, which is composed of a silicon nitride film, is formed above the light receiving element 806. The antireflection film 810 is formed over the light receiving element 806 and the transfer electrode 809. In the prior art, the antireflection film 810 is formed to cover the light receiving element 806 and not to cover a part of the transfer electrode 809. As a result, the inhibition of hydrogen supply to an interface of the oxide film under the transfer electrode 809 is reduced while sensitivity of the light receiving element 806 is maintained.

Further, a structure in which a plasma nitride silicon film is used as a lens forming film is disclosed in each of JP 10-229180 A and JP 06-204443 A. Moreover, it is disclosed in JP 06-204443 A that, in the case where an insulation film configured to be a microlens is composed of a film containing hydrogen such as an SiN film deposited by ECR-CVD in a CCD type solid state imaging device, hydrogenation of a silicon substrate is performed, which effectively suppresses a dark current.

In general, as the amount of hydrogen supply increases from, for example, a plasma silicon nitride film formed as a surface protection film or the like, an amount of hydrogen termination of a dangling bond can be increased. Therefore, it is effective in reducing the influences due to defects that the film that works as a hydrogen supply source be thickened.

However, when the thickness of the surface protection film increases, an internal stress in the film increases accordingly. As a result, a damaged portion such as a crack tends to occur. Further, it is considered that an expansion or tensile stress is applied to the film depending on the temperature of heat treatment after the formation of the surface protection film that works as the hydrogen supply source, as a result of which the crack is apt to occur. Therefore, a slight increase in thickness may cause problems in stability and reliability of an element. Further, JP 06-204443 A presents a problem in that, in the CCD type solid state imaging device, the microlens is formed in a self-aligning manner in an opening portion of a light shielding metal, so that hydrogen is not sufficiently supplied to a portion except for the region of a light receiving element, for example, a portion under a gate of a MOS transistor. Therefore, it has been difficult for the structure of the CCD type solid state imaging device to be simply applied to a MOS type solid state imaging device. As regards, in particular, the MOS type solid state imaging device in which a MOS transistor is used as a switching element, a structure including plural wiring layers is generally adopted in most cases. There has been a case where, when a film, which is capable of supplying hydrogen to a semiconductor substrate, is provided on the wiring layers, the distance between the hydrogen supply film and the semiconductor substrate is long, and thus, suitable hydrogenation treatment is not performed.

SUMMARY OF THE INVENTION

The present invention has been made to solve the above-mentioned problems, and therefore has an object to provide a hydrogen supply structure suitable for a MOS type solid state imaging device. Another object of the present invention is to provide a solid state imaging device with a structure, in which generation of cracks and the like is suppressed even when a hydrogen supply film, which works as a hydrogen supply source, is made thicker for the purpose of improving hydrogen supply capacity, and to provide a digital camera that utilizes the solid state imaging device.

In order to achieve the above-mentioned object, according to the present invention, there is provided a MOS type solid state imaging device, including: a semiconductor substrate; a plurality of pixels arranged on the semiconductor substrate, each pixel having: a light receiving element for generating a signal charge due to incident light; and a MOS transistor for reading the signal charge; and a hydrogen supply film arranged on the semiconductor substrate over the plurality of pixels and having a region corresponding to the light receiving element at least a part of which has a film thickness greater than the other part of the region.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 2A and 2B are schematic diagrams of a solid state imaging device in accordance with a second embodiment of the present invention, in which: FIG. 2A is a sectional view thereof; and FIG. 2B is a plan view of a portion of a silicon nitride film;

FIGS. 3A, 3B, 3C and 3D are schematic diagrams of a solid state imaging device in accordance with a third embodiment of the present invention, in which: FIG. 3A is a sectional view thereof, FIG. 3B is a plan view of a portion of a silicon nitride film; and FIGS. 3C and 3D are plan views showing other structural examples of the silicon nitride film;

Figure 1:
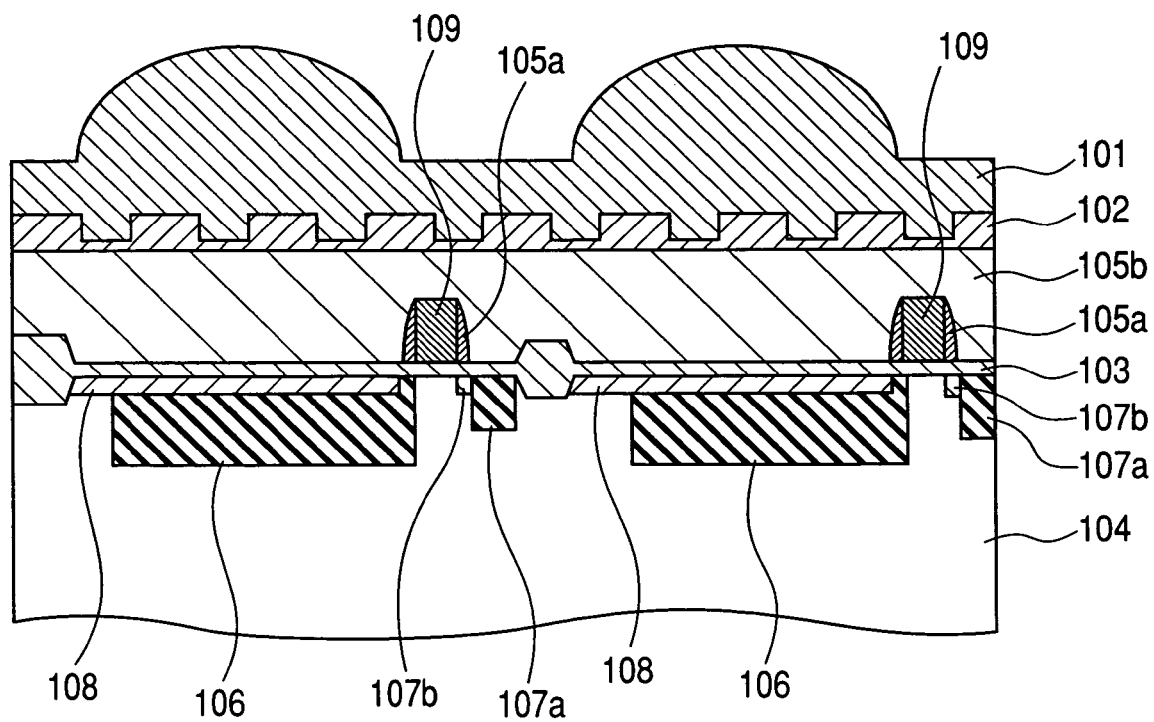
FIG. 1 is a sectional view of a solid state imaging device in accordance with a first embodiment of the present invention.

The accompanying drawings, which are incorporated in and constitute a part of the specification, illustrate embodiments of the invention and, together with the description, serve to explain the principles of the invention.

DESCRIPTION OF THE PREFERRED EMBODIMENTS

The present invention relates to a MOS type solid state imaging device including a semiconductor substrate, a light receiving element which is formed on the semiconductor substrate and generates signal charge through incidence of light, and plural pixels each having a MOS transistor for reading the signal charge from the light receiving element. To be more specific, the MOS type solid state imaging device is characterized in that: a hydrogen supply film is arranged over the plural pixels on the semiconductor substrate; and at least a part of a region corresponding to the light receiving element in the hydrogen supply film is thicker than the other parts.

With the above-described structure, a thin portion, that is, a portion with high crystallinity can exist as a part of the hydrogen supply film. Thus, stress can be alleviated even at the time of formation of a thick film, therefore minimizing distortion levels. Note that the existence of a grain boundary level (electrically active energy level) considered as a breaking factor is the main factor of a fatigue related deterioration phenomenon of a film. The grain boundary level depends on external stress and on Young's modulus relative to the film. The smaller the Young's modulus is, the more difficult it is for distortion of a grain boundary to occur.

Further, the hydrogen supply film is provided not only on the light receiving element but also over the plural pixels including the MOS transistors, whereby the hydrogen supply can be efficiently performed to, for example, a portion under a gate of the MOS transistor. It is preferable that the hydrogen supply film also be arranged onto a peripheral circuit portion for driving the MOS transistor of the pixel. In this case, it is sufficient that the region, which is located on the peripheral circuit portion, of the hydrogen supply film, be arranged with a substantially uniform thickness smaller than that of at least the region corresponding to the light receiving element. Further, in an solid state imaging device having a MOS transistor for signal amplification in a pixel region, it is preferable that a hydrogen supply film be arranged to cover at least the amplification MOS transistor. This is because traps at an interface of Si/Si2 in the vicinity of a gate of the amplification MOS transistor can be reduced, which enables reduction of 1/f noise that is important particularly in the amplification type solid state imaging device.

Here, the hydrogen supply film indicates a film, which, at the time of film formation, contains an amount of hydrogen which enables termination of the dangling bonds of silicon that forms the semiconductor substrate. The film contains a larger amount of hydrogen than at least one peripheral interlayer insulation film. The hydrogen amount will be described later. The hydrogen content of the hydrogen supply film after the hydrogen supply is performed is however less than that at the time of film formation. Also, the hydrogen supply film may not contain the hydrogen amount sufficient for hydrogen supply after the solid state imaging device is completed. Even in those cases, the designation of the hydrogen supply film does not change.

Moreover, another characteristic of the solid state imaging device is that the formed hydrogen supply film is subjected to a heat treatment in a hydrogen atmosphere or in a nitrogen atmosphere according to this solid state imaging device manufacturing method.

According to the manufacturing method, the hydrogen supply film can be used as a hydrogen supply source to the substrate by performing heat treatment. That is, hydrogen contained in the hydrogen supply film is diffused toward the semiconductor substrate through heat treatment. As a result, hydrogen can be supplied to the semiconductor substrate. At this point, generation of cracks can be suppressed even when the hydrogen supply film has a relatively large thickness. The hydrogen supply film with an increased thickness can effectively progress hydrogen supply to the semiconductor substrate.

Hereinafter, description will be made of embodiments of the present invention with reference to the drawings.

First Embodiment

Hereinafter, description will be made of a first embodiment with reference to FIG. 1. FIG. 1 is a sectional view of a portion corresponding to two pixels in a solid state imaging device in accordance with the first embodiment of the present invention.

In the solid state imaging device, an n-type semiconductor region capable of storing signal charge (n-type storage region) 106 is formed in a p-type well 104 formed on a surface of a semiconductor substrate made of silicon. A surface p-type semiconductor region 108 with a high impurity concentration, which is electrically connected with the p-type well 104, is formed on the n-type storage region 106. These components form an embedded photodiode functioning as a light receiving element that generates signal charge. Note that the light receiving element is not limited to an embedded type one, but is preferably of the embedded type for attaining, for example, reduction of surface defects.

Further, an oxide film 103 is formed on the semiconductor substrate through thermal oxidation, and a transfer electrode 109 made of polycrystalline silicon is formed on the oxide film 103. In the p-type well region 104, an n-type semiconductor region 107 is formed to sandwich the region where the transfer electrode 109 is formed with respect to the n-type storage region 106. The n-type storage region 106, the transfer electrode 109, and the n-type semiconductor region 107 constitute a MOS transistor including the transfer electrode 109 as a gate electrode.

Formed on both sides of the transfer electrode 109 are side wall films 105a each of which is made of a residual silicon oxide film at the time of etching-back of a silicon oxide film. Along with the above formation, in the n-type semiconductor region 107, an n-type semiconductor region 107b, which is shallower and has a lower concentration than a high-concentration n-type semiconductor region 107a, is formed to be adjacent to the high-concentration n-type semiconductor region 107a and in the vicinity of the transfer electrode 109. That is, the n-type semiconductor region 107 can have a "lightly doped drain (LDD) structure".

A silicon nitride film 102, which functions as a hydrogen supply source, is further formed on the semiconductor substrate through an interlayer insulation film 105b. The silicon nitride film 102 also functions as a surface protection film, and a microlens 101 is formed thereon. Here, the surface protection film is provided to prevent moisture, Na or the like from the outside from entering an element and deteriorating the characteristics of the element.

In the solid state imaging device with the above-described structure, incident light is condensed to the light receiving element by the microlens 101, so that a photocharge is generated in the light receiving element. The generated photocharge is transferred to the n-type semiconductor region 107 through the transfer electrode 109. Although not shown in the figure, a detection circuit is connected with the n-type semiconductor region 107. A detection signal corresponding to the incident light is outputted through the detection circuit. The solid state imaging device in the first embodiment is structured as an APS in which an amplification element is provided per pixel or plural pixels in the detection circuit.

In the first embodiment, the silicon nitride film 102 has a structure in which: steps are partially provided in a thickness direction thereof; a part of a region corresponding to the light receiving element is thicker than the other parts; and regions with different thicknesses (plural thicknesses) are provided. Further, as shown in FIG. 1, the silicon nitride film is arranged continuously over plural pixels. Unevenness of the silicon nitride film 102, which forms the steps, is formed by the following steps: a flat film is formed by, for example, a plasma chemical vapor deposition (CVD) method; a resist is formed on regions to be convex portions; and etching is performed thereon to form concave portions. At this point, the thickness of the concave portion is controlled by adjusting an etching time, thereby being capable of forming desired unevenness. Note that the boundary between the convex portion and the concave portion has a straight shape in the example shown in FIG. 1, but may also have a curved shape. Further, the film deposition method of the silicon nitride film 102 is not limited to CVD. Other manufacturing methods such as a method of partially forming a film may also be used.

Moreover, the silicon nitride film 102 is subjected to heat treatment in a hydrogen atmosphere or nitrogen atmosphere after the formation. Thus, hydrogen contained in the silicon nitride film 102 is diffused toward the semiconductor substrate. Therefore, the silicon nitride film 102 fulfills a function of promoting the supply of hydrogen to the semiconductor substrate. In such as case, it is preferable to form the silicon nitride film 102 by plasma CVD with the use of silane as a gas, for example, for the film to contain hydrogen atoms.

Through the above-described film deposition, a thin portion with high crystallinity exists in the concave portion in the silicon nitride film 102, so that internal stress of the film is alleviated. Thus, an expansion or tensile stress of the film can be reduced which may be generated through heat treatment after the formation of the surface protection film. Therefore, in the silicon nitride film 102, generation of cracks and the like can be suppressed even with a relatively increased thickness. Accordingly, in accordance with the first embodiment, a hydrogen supply amount can be significantly increased while reliability of a product is maintained. As a result, the influence of defects of the oxide film 103 is lowered to improve linearity of the solid state imaging device and reduce a dark current, thereby being capable of enhancing image quality. Further, a part, which is at the position corresponding to the light receiving element, of the silicon nitride film 102 is formed thicker than the other parts, and thus, hydrogen can be supplied efficiently to the light receiving element. In addition, the silicon nitride film is arranged also onto a pixel region except for the region of the light receiving element, and therefore, hydrogen can also be supplied to a region where a dark current is apt to occur, for example, a portion under a gate of the MOS transistor.

Note that, in the solid state imaging device shown in FIG. 1, it is appropriate that the silicon nitride film 102 formed by plasma CVD have a thin portion with a thickness of approximately from 0.05 m to 1 m and a thick portion with a thickness of approximately from 1 m to 3 m. Further, it is preferable that a concentration of hydrogen contained in the silicon nitride film 102 be $1 \times 10^{21}$ atoms/cm$^3$ or more. Based on this, the present inventors proves that a hydrogen concentration of an interface of the oxide film 103 increased more than ten times as high as in the case where hydrogen supply treatment is performed with the use of a flat silicon nitride film with a thickness of about 600 nm.

Second Embodiment

Figure 2A:
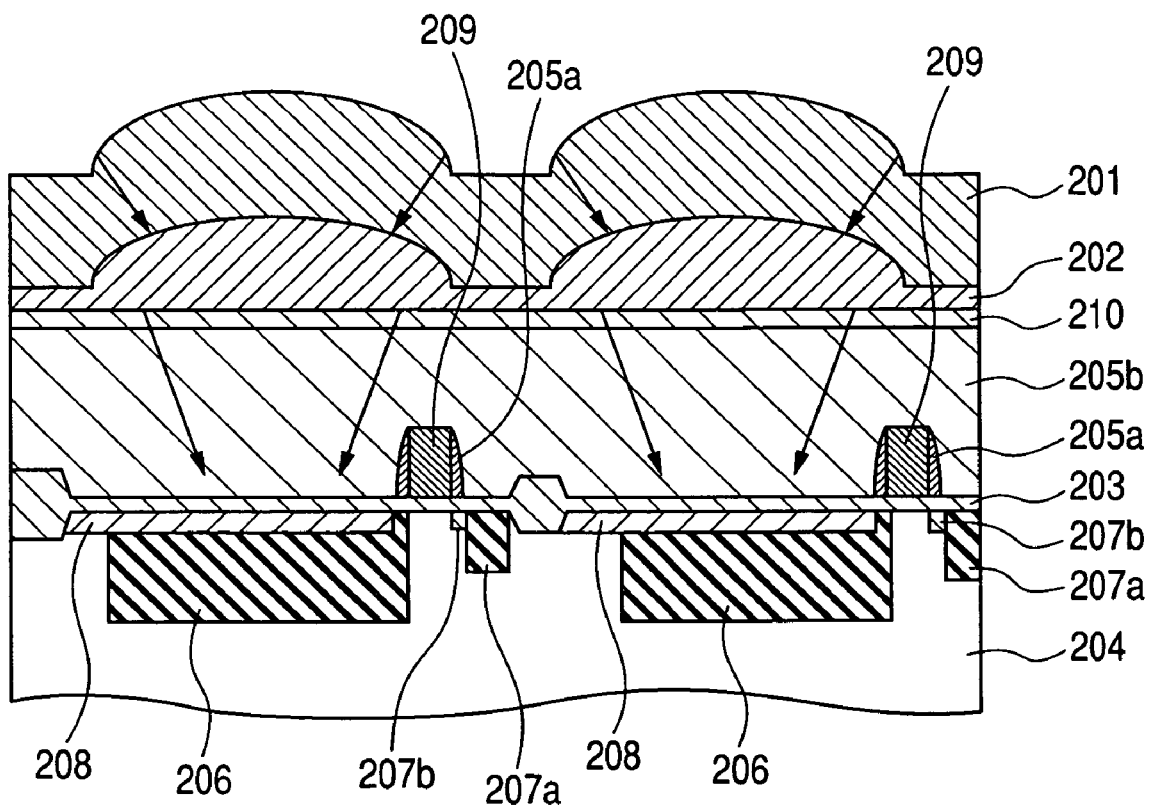
Figure 2B:
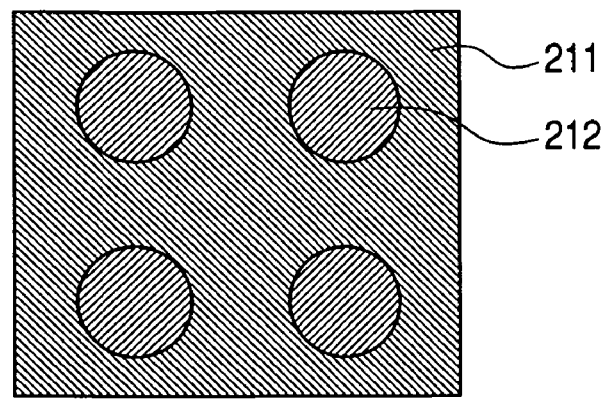

Description will be made of a second Embodiment with reference to FIGS. 2A and 2B. FIG. 2A is a sectional view, and FIG. 2B is a plan view.

A structure of a light receiving element is the same as in the first embodiment, and thus, detailed description thereof will be omitted. Moreover, in the second Embodiment, an embedded photodiode that is a light receiving element is constituted by an n-type storage region 206, which is formed in a p-type well 204 disposed on a surface of a semiconductor substrate, and according to a surface p-type semiconductor region 208 with a high impurity concentration.

Further, reference numeral 203 denotes an oxide film formed through thermal oxidation, and reference numeral 209 denotes a transfer electrode 209 made of polycrystalline silicon. Formed on both sides of the transfer electrode 209 are side wall films 205a each of which is composed of a residual silicon oxide film at the time of etching-back of a silicon oxide film. With the formation, in an n-type semiconductor region 207, an n-type semiconductor region 207b, which is shallower and has a lower concentration than a high-impurity-concentration n-type semiconductor region 207a, is formed to be adjacent to the n-type semiconductor region 207a and in the vicinity of the transfer electrode 209. That is, the n-type semiconductor region 207 can have an LDD structure.

In the second embodiment, a silicon nitride oxide film 210, which functions as an antireflection film for reducing reflection that is caused on an interface between a silicon nitride film 202 and an interlayer insulation film 205b, is arranged on the interlayer insulation film 205b on the semiconductor substrate. The silicon nitride film 202 is arranged thereon. A microlens 201 is further arranged on the silicon nitride film 202.

Here, the antireflection film indicates a film for reducing components of reflected light generated from a difference in index of refraction at an interface between layers. Here, the silicon nitride oxide film 210 as the antireflection film is used for reducing reflection at the interface between the silicon nitride film 202 and the interlayer insulation film 205b. The silicon nitride film 202 has an index of refraction of 2.04, and the silicon nitride oxide film 210 as the antireflection film has an index of refraction of 1.68. Both the values of the indexes are relatively close to each other. Thus, the loss of the incident light through reflection is suppressed, and the light can efficiently reach the light receiving element.

In the second embodiment, the silicon nitride film 202 includes a portion having a convex shape per pixel, which is denoted by reference numeral 212 in FIG. 2B, and includes a function of condensing light onto the light receiving element. Thus, the silicon nitride film 202 has a function of an interlayer lens in addition to functioning as a surface protection film. That is, the convex-shaped portion is formed with a predetermined curvature, thereby being capable of functioning as a lens. A peripheral portion of the convex portion and a portion located between pixels, both denoted by reference numeral 211 in FIG. 2B, in the silicon nitride film 202, are flat. With this structure, the silicon nitride film 202 has regions with thicknesses different from each other, and at least a part of the region, which corresponds to the light receiving element, in the silicon nitride film 202 is thicker than the other parts.

Further, as in the second embodiment, in a sensor generally called a CMOS sensor (active sensor), in which plural transistors are formed for pixels including those in a detection circuit and which is manufactured by a CMOS process together with a peripheral circuit, it is necessary to provide multiple wiring layers. Therefore, in such a solid state imaging device, the height between the light receiving element and the microlens tends to increase. In the second embodiment, the silicon nitride film 202 is configured to have the function of the interlayer lens. As a result, although the light receiving element is relatively distant from the microlens 201, even with the light obliquely incident onto the microlens 201, the loss of the light to the portion except for the light received by the light receiving element, is reduced, leading to enhanced sensitivity. Therefore, in a camera provided with the solid state imaging device in the second embodiment, it is possible to increase the degree of freedom in optical design of the camera itself. Accordingly, a digital camera and a video camera can be provided each of which has a small size, high sensitivity, and high in-plane uniformity in luminance.

Further, it is necessary that the silicon nitride film 202 is disposed such that the convex-shaped portion 212 is formed having an appropriate width and thickness to have a light condensing function. It is appropriate that the silicon nitride film 202 has a width of about 5 m and a thickness of about 1 m, for example. As described above, in the structure of the second embodiment, even when a relatively thick portion is provided in the silicon nitride film 202, generation of cracks and the like can be suppressed. At the same time, the silicon nitride film 202 can also have a function of supplying hydrogen, that is, a function of reducing the influence of defects on an interface of the oxide film 203 through heat treatment before the formation of the microlens 201. At this point, the silicon nitride film 202 can be formed relatively thick as described above. Thus, the hydrogen supply amount is significantly increased, which leads to an enhanced action of reducing the influence of defects. Also, the silicon nitride film is arranged also onto a pixel region except for the region of the light receiving element, and therefore, hydrogen can also be supplied to the region where a dark current is apt to occur, for example, a portion under a gate of a MOS transistor.

Third Embodiment

Figure 3A:
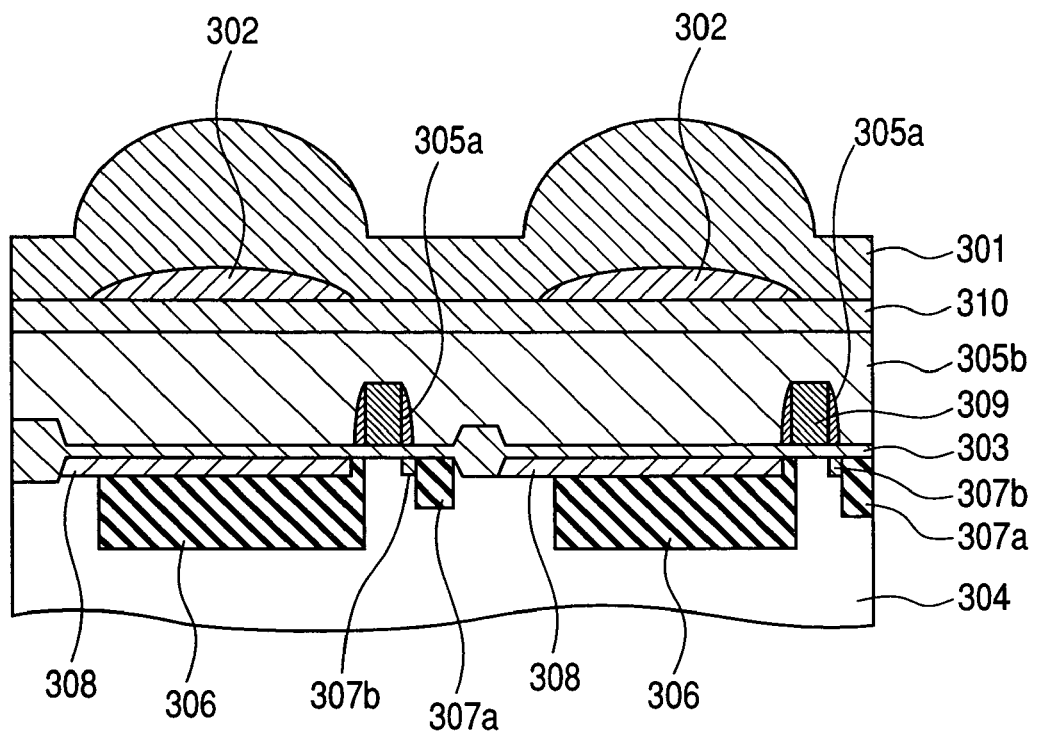
Figure 3B:
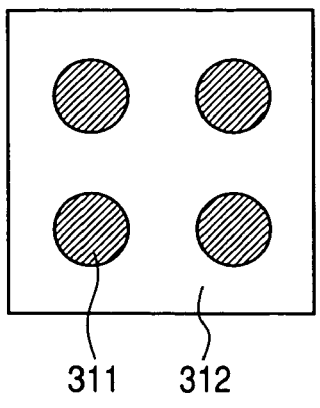

Description will be made of a third embodiment with reference to FIGS. 3A and 3B. FIG. 3A is a sectional view, and FIG. 3B is a plan view.

Also in the second embodiment, an embedded photodiode functioning as a light receiving element is constituted by an n-type storage region 306, which is formed in a p-type well 304 formed on a surface of a semiconductor substrate made of silicon, and a surface p-type semiconductor region 308 with a high impurity concentration which is electrically connected with the p-type well 304. Further, a transfer electrode 309 made of polycrystalline silicon is formed on an oxide film 303 formed on the semiconductor substrate through thermal oxidation. Formed on both sides of the transfer electrode 309 are side wall films 305a each of which is made of a residual silicon oxide film at the time of etching-back of a silicon oxide film. Therefore, an LDD structure can be provided.

In the third embodiment, a silicon nitride oxide film 310, which consists of a antireflection film having the same function as in the second embodiment, is formed on an interlayer insulation film 305b on the semiconductor substrate. Formed thereon is a silicon nitride film 302 having a convex shape, which includes a function of condensing light onto the light receiving element. Further, a microlens 301 is formed thereon. In the third embodiment, the silicon nitride film 302 is formed only at portions where an interlayer lens is formed and which are denoted by reference numeral 311 in FIG. 3B. In other words, the silicon nitride film 302 is provided with a portion where a silicon nitride oxide film 313 under the silicon nitride film 302 is exposed and which is denoted by reference numeral 312 which constitutes an opening portion. As described in the second embodiment, the silicon nitride film 302 also has a function of a surface protection film. However, the silicon nitride oxide film 313 also functions as a surface protection layer at the portion where the silicon nitride oxide film 313 is exposed from the silicon nitride film 302.

With the structure in the third embodiment, because of its lens shape, the silicon nitride film 302 has regions with thicknesses different from one another, and in addition, has the opening portion. The opening portion enables the reduction of internal stress. Also, even with an increased thickness of the silicon nitride film 302, generation of cracks and the like can be suppressed. As is the case in the second embodiment, the increased thickness can increase the hydrogen supply amount. Further, the opening portion of the silicon nitride film 302 functions as a path for the hydrogen supply in a direction of an interface of the oxide film 303. This also can significantly increase the hydrogen supply amount. Further, a part of the region, which corresponds to the light receiving element, in the silicon nitride film 302 is thicker than the other parts, and thus, hydrogen supply to the light receiving element can be realized efficiently. The above-described increase of the hydrogen supply amount effectively reduces the defects in the oxide film 303, which leads to the improvement in the linearity of the solid state imaging device and the reduction of the dark current, thereby being capable of improving image quality. In addition, except for the region of the light receiving element, because the silicon nitride film is arranged also onto at least a part of a transfer MOS transistor, hydrogen can also be supplied to a region where a dark current is apt to occur, for example, a portion under a gate of the MOS transistor.

Note that the structure in which the silicon nitride film 302 has the opening portion is not limited to the structures shown in FIGS. 3A and 3B. The respective structures shown in FIGS. 3C and 3D may also be adopted.

Figure 3C:
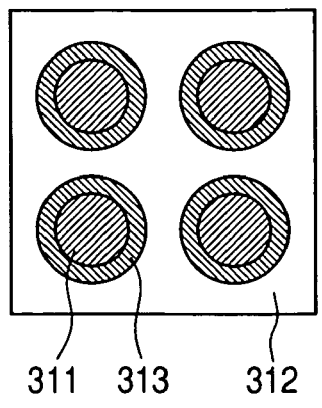

In the structure shown in FIG. 3C, the silicon nitride film 302 includes a portion having a flat surface which is denoted by reference numeral 313 in the periphery of the convex-shaped portion denoted by reference numeral 311. The respective regions denoted by reference numerals 311 and 313 are independently provided per pixel. The opening portion, where the silicon nitride oxide film 310 is exposed and which is denoted by reference numeral 312, is formed among pixels.

Figure 3D:
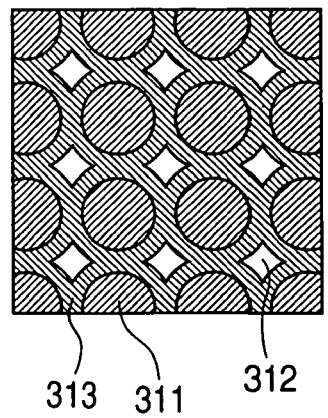

In the structure shown in FIG. 3D, the portions each having a flat surface, which are denoted by reference numeral 313, in the periphery of the convex-shaped portions denoted by reference numeral 311 are coupled with one another among pixels. At this point, the portions each having a flat surface, which are denoted by reference numeral 313, each have a ring shape. Opening portions 312, each of which substantially has a shape of a rhomboid having the respective edges of four rings as its sides, are formed among the pixels.

Fourth Embodiment

Figure 4:
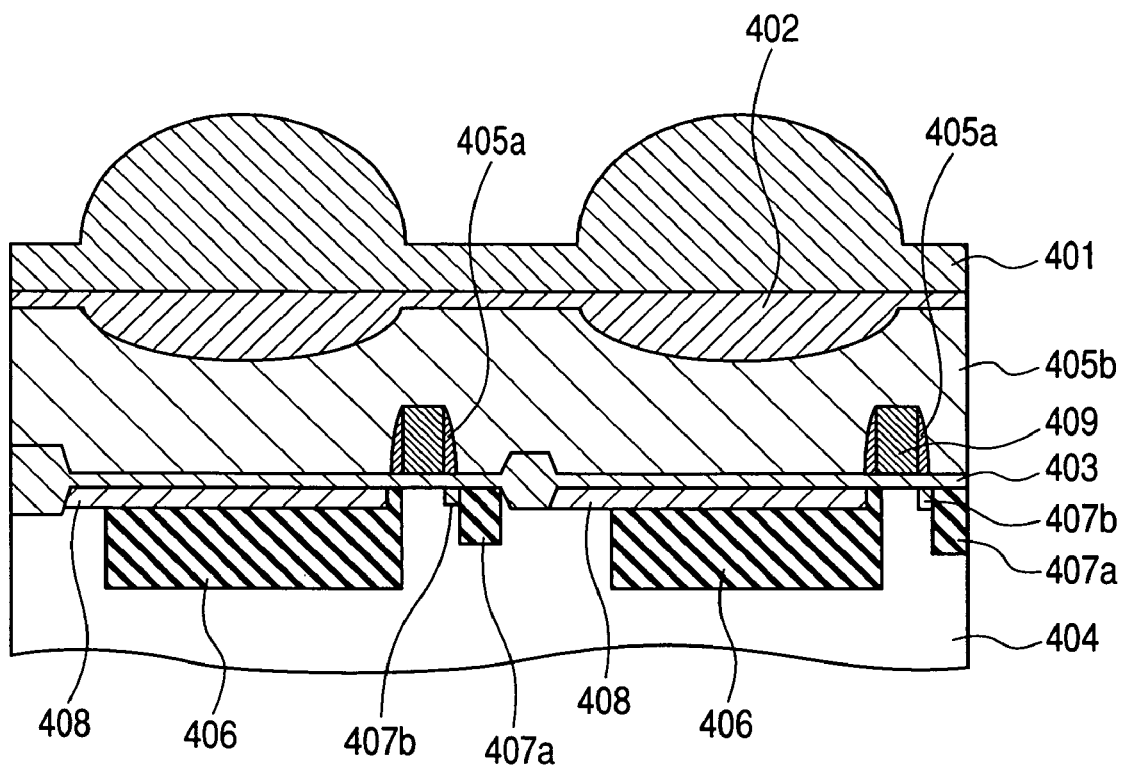
FIG. 4 is a sectional view of a solid state imaging device in accordance with a fourth embodiment of the present invention.

Description will be made of a fourth embodiment with reference to FIG. 4.

Also in the forth embodiment, an embedded photodiode functioning as a light receiving element is constituted by an n-type storage region 406, which is formed in a p-type well 404 formed on a surface of a semiconductor substrate made of silicon, and a surface p-type semiconductor region 408 with a high impurity concentration which is electrically connected with the p-type well 404. Further, a transfer electrode 409 made of polycrystalline silicon is formed on an oxide film 403 formed on the semiconductor substrate through thermal oxidation. Formed on both the sides of the transfer electrode 409 are side wall films 405a each of which is made of a residual silicon oxide film at the time of etching-back of a silicon oxide film. Therefore, an LDD structure can be provided.

Further, in the fourth embodiment, a silicon nitride film 402 having a downward convex portion is formed on an interlayer insulation film 405b on the semiconductor substrate to have a function of condensing light onto the light receiving element. A microlens 401 is further formed on the silicon nitride film 402. The function of condensing light onto the light receiving element can also be realized by the silicon nitride film 402 having its downward convex portion based on a relationship of index of refraction and the interlayer insulation film 405b. The above-described silicon nitride film 402 can be formed by CVD with the use of, for example, a wiring layer (not shown) which exists above the transfer electrode 409, the light receiving element, and an n-type semiconductor region 407a.

In the fourth embodiment, the silicon nitride film 402 has a downward convex shape that points to an interface of the oxide film 403, and thus, has a large surface area in the downward direction. A hydrogen amount supplied in the downward direction in which the interface of the oxide film 403 exists accordingly. As a result, the hydrogen supply amount can be significantly increased, which reduces the influence of defects in the oxide film 403 and which leads to an improvement in linearity of the solid state imaging device and to a reduction of a dark current, thereby being capable of improving image quality. In addition, because the silicon nitride film is arranged onto a pixel region except for the region of the light receiving element, hydrogen can also be supplied to a region where a dark current is apt to occur, for example, a portion under a gate of a MOS transistor.

Fifth Embodiment

Figure 5:
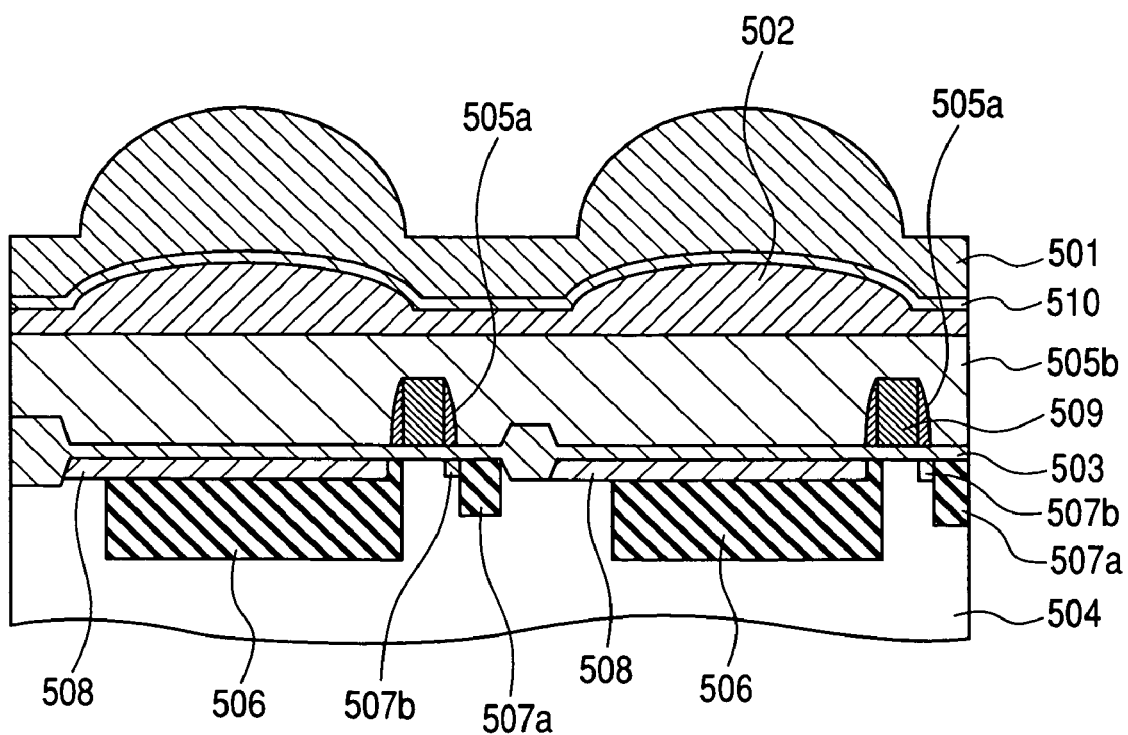
FIG. 5 is a sectional view of a solid state imaging device in accordance with a fifth embodiment of the present invention.

Description will be made of a fifth embodiment with reference to FIG. 5.

Also in the fifth embodiment, an embedded photodiode functioning as a light receiving element is constituted by an n-type storage region 506, which is formed in a p-type well 504 formed on a surface of a semiconductor substrate made of silicon, and a surface p-type semiconductor region 508 with a high impurity concentration which is electrically connected with the p-type well 504. Further, a transfer electrode 509 made of polycrystalline silicon is formed on an oxide film 503 formed on the semiconductor substrate through thermal oxidation. Formed on both the sides of the transfer electrode 509 are side wall films 505a each of which is made of a residual silicon oxide film at the time of etching-back of a silicon oxide film. Therefore, an LDD structure can be provided.

Further, in the fifth embodiment, a silicon nitride film 502 having a convex-shaped portion is formed on an interlayer insulation film 505b on the semiconductor substrate to have a function of condensing light onto the light receiving element. Then, a transparent hydrogen diffusing protection film 510 is formed on the silicon nitride film 502. A microlens 501 is further formed thereon.

In the fifth embodiment, the formation of the hydrogen diffusing protection film 510 suppresses diffusion of hydrogen to the portion above the silicon nitride film 502. Thus, hydrogen can be efficiently supplied toward an interface of the oxide film 503. Note that a silicon nitride film formed by, for example, LPCVD can be used as the transparent hydrogen diffusing protection film 510; however, other films may also be used as long as diffusion of hydrogen to the upper side can be suppressed. A hydrogen supply amount is significantly increased. This reduces the influence of defects in the oxide film 503, which leads to an improvement in linearity of the solid state imaging device and to a reduction of a dark current, thereby being capable of improving image quality. In addition, the silicon nitride film is arranged also onto a pixel region except for the region of the light receiving element, and therefore, hydrogen can also be supplied effectively to a region where a dark current is apt to occur, for example, a portion under a gate of a MOS transistor.

Sixth Embodiment

Figure 6A:
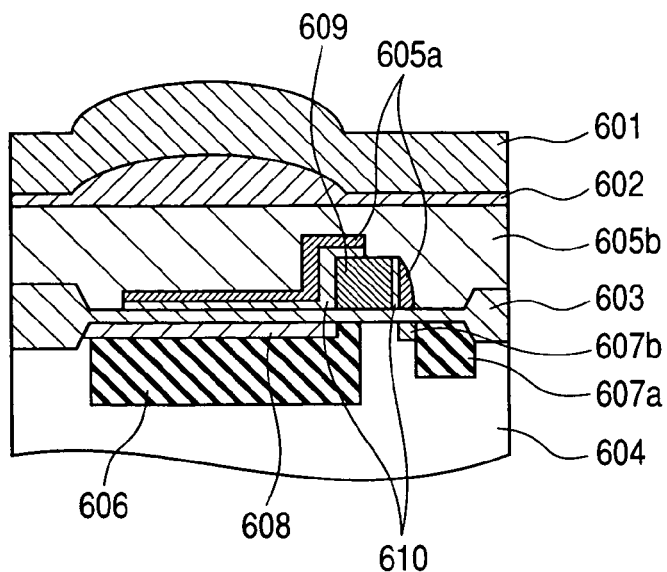
FIGS. 6A and 6B are sectional view of a solid state imaging device in accordance with a sixth embodiment of the present invention.
Figure 6B:
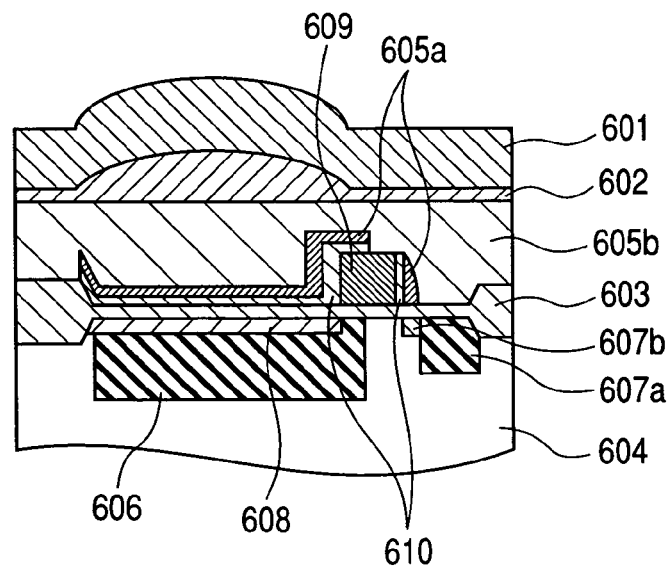

Description will be made of a sixth embodiment with reference to FIGS. 6A and 6B.

Also in the sixth embodiment, an embedded photodiode functioning as a light receiving element is constituted by an n-type storage region 606, which is formed in a p-type well 604 formed on a surface of a semiconductor substrate made of silicon, and a surface p-type semiconductor region 608 with a high impurity concentration which is electrically connected with the p-type well 604. Further, a transfer electrode 609 made of polycrystalline silicon is formed on an oxide film 603 formed on the semiconductor substrate through thermal oxidation. Formed on both sides of the transfer electrode 609 are side wall films 605a each of which is made of a residual silicon oxide film at the time of etching-back of a silicon oxide film. Therefore, an LDD structure can be provided. Further, a silicon nitride film 602 having a convex-shaped portion is formed on an interlayer insulation film 605b on the semiconductor substrate having a function of condensing light onto the light receiving element. A microlens 601 is further formed thereon.

Moreover, in the sixth embodiment, a antireflection film 610 is formed on the light receiving element. Here, the antireflection film 610 has a function of suppressing reflection on the surface of the light receiving element which arises from a difference in index of refraction between the light receiving surface and the oxide film 603 which is a passivation film. The antireflection film 610 may consist of a silicon nitride film formed by, for example, LPCVD. In this regard, the antireflection film 610 may consist of a silicon nitride film, but has quality different from that of the silicon nitride film 602. While the silicon nitride film 602 functions as a hydrogen supply source, the silicon nitride film forming the antireflection film 610 has non hydrogen transmitting property.

In the sixth embodiment, the antireflection film 610 is provided to suppress reflection of incident light onto the light receiving element, which leads to an enhanced sensitivity of a solid state imaging device.

At this point, the antireflection film 610 is impenetrable to hydrogen supplied from the silicon nitride film 602 as described above. Thus, in the sixth embodiment, the antireflection film 610 is formed not to cover some parts of the transfer electrode 609. Therefore, hydrogen can be effectively supplied to the portion, which is located under the transfer electrode 609, in the oxide film 603. Accordingly, the influence of defects of the oxide film 603 can be reduced.

Figure 10:
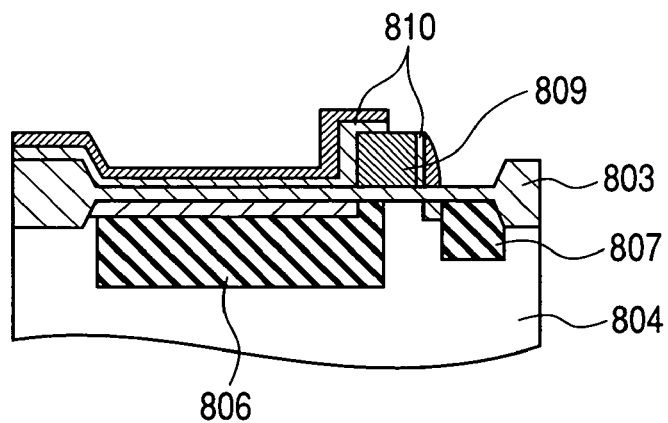
FIG. 10 is a sectional view of a conventional solid state imaging device.

Further, in the solid state imaging device, the light receiving element is generally isolated from other parts as a local oxidation of silicon (LOCOS) portion. The so-called bird's beak is formed at an end portion of the LOCOS portion, and it is known that a large number of defects are apt to occur in the bird's beak. In the prior art shown in FIG. 10, a antireflection film 810 covers not only the entire light receiving element but also a peripheral region thereof. Thus, the entire bird's beak portion is also covered by the antireflection film 810. Therefore, in the conventional art, it is difficult for the hydrogen to be sufficiently supplied to the bird's beak portion, and thus, it is difficult to reduce the influence of defects in the portion. On the other hand, in the structure of the sixth embodiment which is shown in FIG. 6A, the antireflection film 610 is formed in a way not to cover the bird's beak portion. Thus, hydrogen can be effectively supplied to the bird's beak portion. This improves the effect of terminating a dangling bond with hydrogen to reduce the influence of defects, which leads to the improvement in image quality of the solid state imaging device. Further, in the structure of FIG. 6A, a part in the vicinity of the bird's beak portion on the light receiving element is not covered by the antireflection film 610 either. Thus, the effect of reducing defects can be enhanced. Moreover, as shown in FIG. 6B, with the structure in which a part of the bird's beak portion is not covered by the antireflection film 610, the effect of reducing defects can be enhanced compared with the structure in the prior art in which the entire bird's beak portion is covered by the antireflection film 810. In addition, the silicon nitride film is arranged also onto a pixel region except for the region of the light receiving element, and therefore, hydrogen can also be supplied effectively to a region where a dark current is apt to occur, for example, a portion under a gate of a MOS transistor. In particular, since the hydrogen supply film is arranged also on the MOS transistor portion, hydrogen can be efficiently supplied from the region where the antireflection film is not arranged compared with the case where the hydrogen supply film is arranged only on the light receiving element.

Seventh Embodiment

Figure 7:
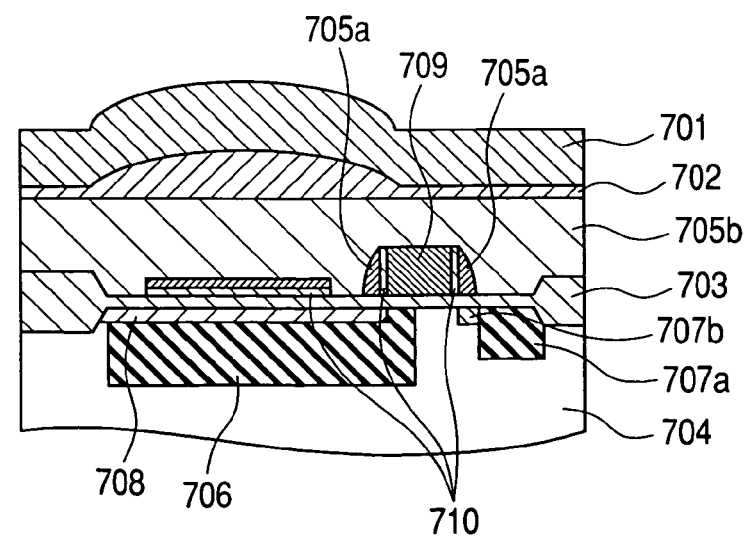
FIG. 7 is a sectional view of a solid state imaging device in accordance with a seventh embodiment of the present invention.

Description will be made of a seventh embodiment with reference to FIG. 7.

Also in a the seventh embodiment, an embedded photodiode functioning as a light receiving element is constituted by an n-type storage region 706, which is formed in a p-type well 704 formed on a surface of a semiconductor substrate made of silicon, and a surface p-type semiconductor region 708 with a high impurity concentration which is electrically connected with the p-type well 704. Further, a transfer electrode 709 made of polycrystalline silicon is formed on an oxide film 703 formed on the semiconductor substrate through thermal oxidation. Formed on both the sides of the transfer electrode 709 are side wall films 705a each of which is made of a residual silicon oxide film at the time of etching-back of a silicon oxide film. Therefore, an LDD structure can be provided. Further, a silicon nitride film 702 having a convex-shaped portion is formed on an interlayer insulation film 705b on the semiconductor substrate to have a function of condensing light onto the light receiving element. A microlens 701 is further formed thereon.

Further, in the seventh embodiment, a antireflection film 710 is formed above the light receiving element as in the sixth embodiment. In the sixth embodiment, the antireflection film 610 covers the end portion of the transfer electrode 609 on the light receiving element side. However, in the seventh embodiment, the antireflection film 710 is formed without covering end portions of the transfer electrode 709 on the light receiving element side. With this structure, hydrogen easily reaches the part of the interface of the oxide film 703 which is located under the transfer electrode 709. Therefore, hydrogen termination of a dangling bond is effectively performed, and the effect of reducing defects in the portion under the transfer electrode 709 can be enhanced. Accordingly, the charge loss at the time of transfer from the light receiving element is reduced, which leads to the improvement in linearity of a solid state imaging device. In addition, the silicon nitride film is arranged also onto a pixel region except for the region of the light receiving element, and therefore, hydrogen can also be supplied effectively to a region where a dark current is apt to occur, for example, a portion under a gate of a MOS transistor.

Eighth Embodiment

Figure 8:
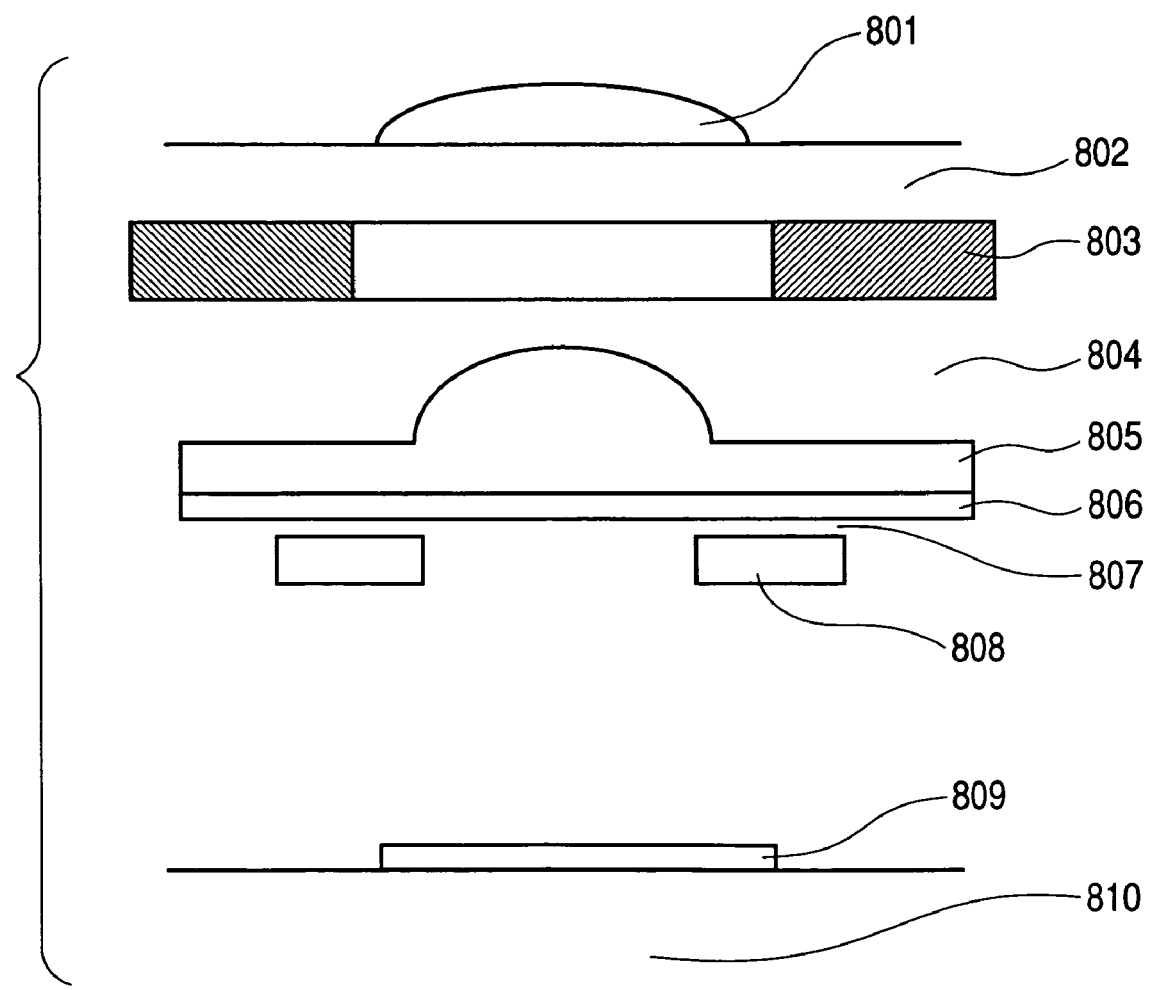
FIG. 8 is a sectional view of a solid state imaging device in accordance with an eighth embodiment of the present invention.

FIG. 8 is a sectional view of a solid state imaging device in accordance with an eighth embodiment. In FIG. 8, reference numeral 801 denotes a microlens; 802, a first leveling film; 803, a color filter; 804, a second leveling film; 805, an interlayer lens that functions also as a hydrogen supply source; 806, a first antireflection film; 807, an interlayer insulation film; 808, a wiring layer; 809, a second antireflection film; and 810, a light receiving element. In the eighth embodiment, the interlayer lens 805 consists of a silicon nitride film, and functions as a hydrogen supply film. At least a part of the interlayer lens 805 which corresponds to the light receiving element is formed thick. In addition, the silicon nitride film is arranged also onto a pixel region except for the region of the light receiving element, and therefore, hydrogen can also be supplied effectively to a region where a dark current is apt to occur, for example, a portion under a gate of a MOS transistor.

As regards a process of manufacturing the interlayer lens 805, a lens shape is formed by RIE, and then, the resultant is subjected to heat treatment in a hydrogen atmosphere or nitrogen atmosphere at 400 C to 470 C for a period of 30 minutes to a period of 3 hours. This promotes hydrogen supply from the interlayer lens 805 to the light receiving element. Hydrogen is diffused through heat treatment after the lens shape is obtained as described above. Accordingly, hydrogen supply can be performed efficiently compared with the case where a silicon nitride film having a uniform thickness is subjected to heat treatment.

Ninth Embodiment

Figure 11:
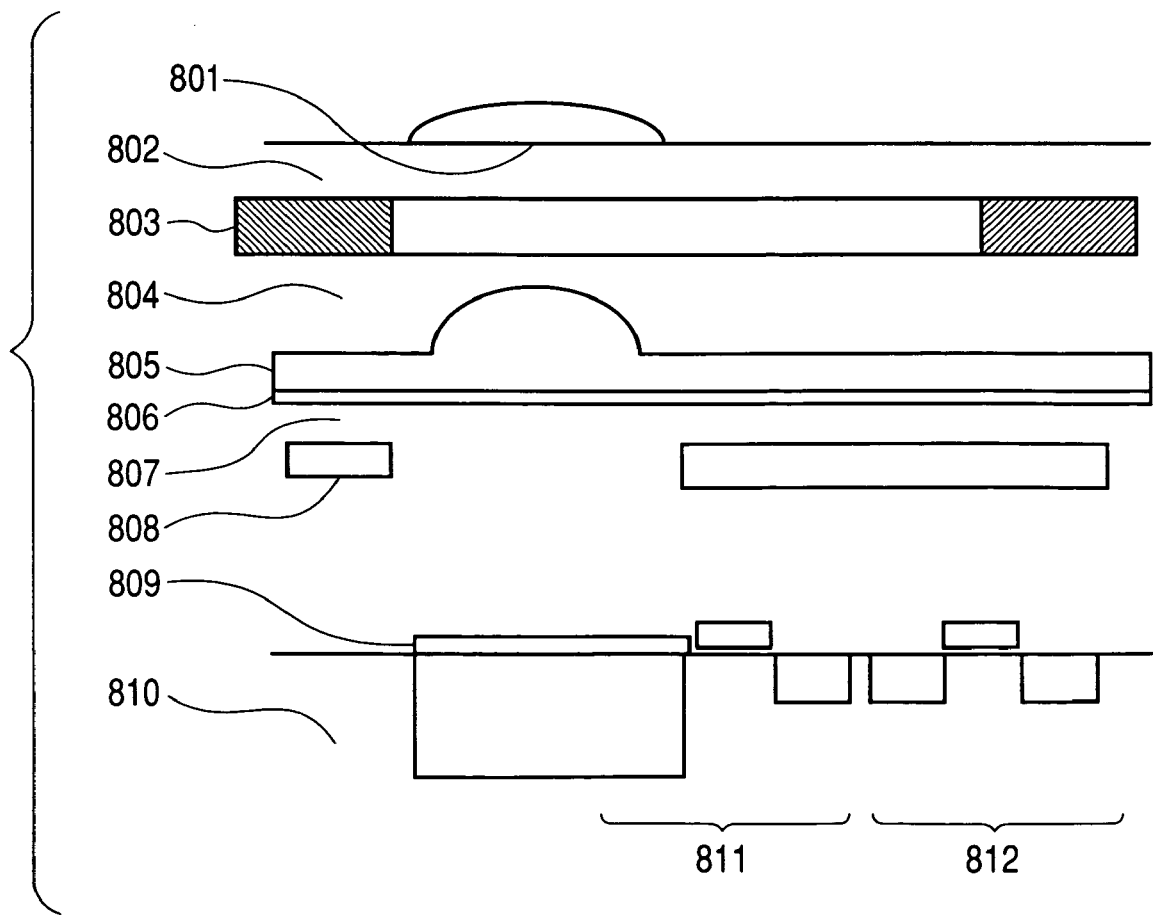
FIG. 11 is a sectional view of a solid state imaging device in accordance with a ninth embodiment of the present invention.

FIG. 11 is a sectional view of a solid state imaging device in accordance with a ninth embodiment. Parts having the same functions as those in FIG. 8 are denoted by the same reference numerals, and detailed description thereof will be omitted. In the ninth embodiment, an amplification element, for example, an amplification MOS transistor 812 and a transfer MOS transistor 811 are provided per pixel or plural pixels in a pixel region. In the structure including the amplification MOS transistor, a silicon nitride film, which functions as a hydrogen supply film, is arranged on at least a part of the amplification MOS transistor. With such a structure, traps can be reduced on an interface of Si/SiO2 in the vicinity of a gate of the amplification MOS transistor. As a result, it is possible to reduce 1/f noise which is particularly important in an amplification type solid state imaging device. Further, in the ninth embodiment, the entire amplification MOS transistor is covered by the silicon nitride film; however, the above effect can be obtained as long as a part of the transistor is covered by the silicon nitride film.

Structural Example of Digital Camera

Figure 9:
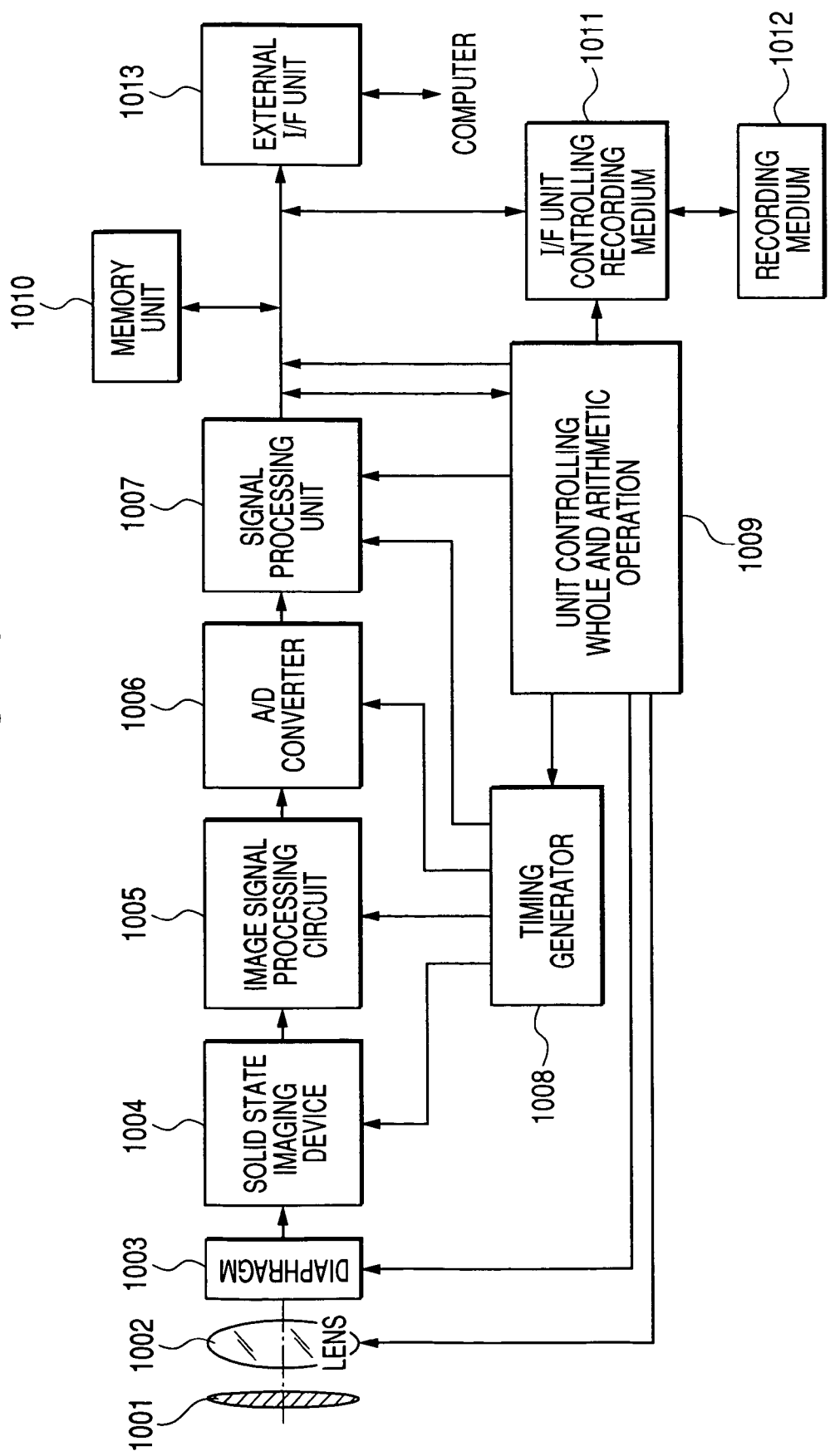
FIG. 9 is a block diagram of a structure of a digital camera as an example of application of the solid state imaging device of the present invention.

FIG. 9 is a block diagram showing a structure of a digital camera as an example of application of the solid state imaging device of the present invention.

The digital camera includes a shutter 1001, a photographic lens 1002, and a diaphragm 1003 as components that direct light to a light receiving element in a solid state imaging device 1004. The shutter 1001 is arranged in front of the photographic lens 1002, and controls exposure of the solid state imaging device to the light. The incident light is imaged to the solid state imaging device 1004 by means of the photographic lens 1002. At this point, the light amount is controlled by the diaphragm 1003 if necessary.

A signal, which is outputted from the solid state imaging device 1004, corresponding to the directed light is processed by an image signal processing circuit 1005, and is converted from an analog signal to a digital signal by an A/D converter 1006. The outputted digital signal is further subjected to arithmetic processing by a signal processing unit 1007, whereby data of picked-up images is produced. The data of picked-up images can be stored into a memory 1010 mounted in the digital camera or sent to an external device such as a computer through an external I/F unit 1013 in accordance with a setting of an operation mode of a user. Further, the data of picked-up images can be recorded in a recording medium 1012, which is detachably attachable to the digital camera, through an I/F unit 1011 controlling a recording medium.

The solid state imaging device 1004, the image signal processing circuit 1005, the A/D converter 1006, and the signal processing unit 1007 are controlled by a timing generator 1008. Moreover, the entire system is controlled by a unit 1009 controlling whole and arithmetic operation.

Note that, in the case of structuring a digital camera that takes color images according to each of the above-described embodiments, a color type can be adopted for the solid state imaging device. it is preferable to structure the color-type solid state imaging device with a color filter disposed between a silicon nitride film and a microlens.

This application claims priority from Japanese Patent Application No. 2004-257313 filed on Sep. 3, 2004, which is hereby incorporated by reference herein.

What is claimed is:
1. A MOS type solid state imaging device, comprising:
a semiconductor substrate; and
a plurality of pixels arranged on the semiconductor substrate, each pixel including:
a light receiving element for generating a signal charge due to incident light,
a gate electrode for reading the signal charge,
a gate insulation film, which covers the whole surface of the light receiving element, and which is formed by an oxide film,
an element isolation portion, which is provided adjacent to the light receiving element, and which is formed by an oxide film,
a hydrogen supply film having a convex shape in a region corresponding to the light receiving element for condensing the incident light onto the light receiving element, wherein the hydrogen supply film is a silicon nitride film formed by a plasma CVD process, such that a concentration of hydrogen in the hydrogen supply film is equal to or greater than $1 \times 10^{21}$ atoms/cm$^3$,
an interlayer insulation film arranged below the hydrogen supply film and above the light receiving element,
an antireflection film for reducing reflection of the incident light at a surface of a light incident area, and
a microlens arranged above the hydrogen supply film, wherein
the antireflection film is a silicon nitride film formed by a LPCVD process to have a property different from the silicon nitride film formed by the plasma CVD process and corresponding to the hydrogen supply film, such that the antireflection film is impenetrable by hydrogen from the hydrogen supply film,
the antireflection film is provided above the light receiving element and the antireflection film extends above the gate electrode,
the antireflection film is provided in contact with the gate insulation film at the surface of the light receiving element,
an end of the antireflection film is laterally spaced apart from the element isolation portion, such that the antireflection film is not disposed above an end of the light receiving element adjacent to the element isolation portion, a region of the light receiving element not covered by the antireflection film is opened to the interlayer insulation film via the gate insulation film, a region of the gate electrode is not covered by the antireflection film and is in contact with the interlayer insulation film, and the region of the light receiving element not covered by the antireflection film makes a path for supplying hydrogen to the element isolation portion, and the region of the gate electrode not covered by the antireflection film makes a path for supplying hydrogen under the gate electrode.

2. A MOS type solid state imaging device according to claim 1, wherein:

the light receiving element is isolated by a LOCOS portion; and the antireflection film is arranged not to cover at least a part of a bird's beak that exists at an end of the LOCOS portion.

3. The MOS type solid state imaging device according to claim 1, wherein the light receiving element has a first conductive type storage region and a second conductive type surface region, the first conductive type storage region of the light receiving element extends under the gate electrode, and the second conductive type surface region of the light receiving element is not disposed under the gate electrode.

4. The MOS type solid state imaging device according to claim 1, wherein each pixel further includes a sidewall, a first impurity diffusing region of a first conductive type, and a second impurity diffusing region of a first conductive type, the second impurity diffusing region having lower impurity concentration than the first impurity diffusing region, and wherein the sidewall has a laminated structure of the antireflection film and the oxide film.

* * * * *